United States Patent
Fan et al.

(10) Patent No.: US 9,140,299 B2
(45) Date of Patent: Sep. 22, 2015

(54) SLIDE RAIL ASSEMBLY

(71) Applicant: ShenZhen Treasure City Technology Co., LTD., ShenZhen (CN)

(72) Inventors: Chen-Lu Fan, New Taipei (TW); Li-Ping Chen, New Taipei (TW)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 71 days.

(21) Appl. No.: 14/102,635

(22) Filed: Dec. 11, 2013

(65) Prior Publication Data

US 2014/0334750 A1 Nov. 13, 2014

(30) Foreign Application Priority Data

May 7, 2013 (TW) .............................. 102116225 A

(51) Int. Cl.
| | |
|---|---|
| A47B 88/00 | (2006.01) |
| F16C 29/00 | (2006.01) |
| F16C 43/02 | (2006.01) |
| F16C 35/02 | (2006.01) |
| A47B 88/06 | (2006.01) |
| H05K 7/14 | (2006.01) |

(52) U.S. Cl.
CPC .............. *F16C 29/005* (2013.01); *A47B 88/06* (2013.01); *F16C 35/02* (2013.01); *F16C 43/02* (2013.01); *H05K 7/1489* (2013.01); *A47B 2210/09* (2013.01); *F16C 29/004* (2013.01)

(58) Field of Classification Search
CPC ............. A47B 88/0418; A47B 88/044; A47B 2210/0059; H05K 7/1489
See application file for complete search history.

(56) References Cited

U.S. PATENT DOCUMENTS

| | | | | |
|---|---|---|---|---|
| 6,948,691 | B2 * | 9/2005 | Brock et al. | 248/222.13 |
| 7,192,103 | B2 * | 3/2007 | Hamilton | 312/334.5 |
| 7,798,582 | B2 * | 9/2010 | Yu et al. | 312/334.4 |
| 7,950,753 | B2 * | 5/2011 | Liang | 312/334.4 |
| 2003/0107309 | A1 * | 6/2003 | Lauchner | 312/334.5 |
| 2003/0111436 | A1 * | 6/2003 | Basinger et al. | 211/183 |
| 2004/0217073 | A1 * | 11/2004 | Dobler et al. | 211/26 |
| 2008/0284300 | A1 * | 11/2008 | Wu et al. | 312/334.1 |
| 2008/0303390 | A1 * | 12/2008 | Hsiung et al. | 312/223.1 |
| 2010/0072153 | A1 * | 3/2010 | Chen et al. | 211/183 |
| 2011/0192946 | A1 * | 8/2011 | Yu et al. | 248/222.11 |
| 2011/0240580 | A1 * | 10/2011 | Yu et al. | 211/183 |
| 2012/0076446 | A1 * | 3/2012 | Chen et al. | 384/21 |

* cited by examiner

*Primary Examiner* — Hanh V Tran
(74) *Attorney, Agent, or Firm* — Novak Druce Connolly Bove + Quigg LLP

(57) ABSTRACT

A slide rail assembly includes a mounting panel, a slide rail secured to the mounting panel, a clipping member, and a driving member. The slide rail includes an outer slide. The outer slide includes a retaining panel attached to an outer surface of the mounting panel. The clipping member is attached to an inner surface of the mounting panel for preventing the slide rail from moving in a direction that is substantially perpendicular to the mounting panel. The driving member is slidably attached to the outer slide and abuts the clipping member. The clipping member is deformable to disengage from the mounting panel when the driving member slides relative to the outer slide.

16 Claims, 5 Drawing Sheets

SLIDE RAIL ASSEMBLY

BACKGROUND

1. Technical Field

The present disclosure relates to mounting apparatuses, and particularly to an assembly for securing a slide rail.

2. Description of Related Art

Slide rail assemblies include two or more telescoping slide segments. An outer or stationary slide segment is mounted to a frame of a rack. An intermediate slide segment is movably attached to the outer slide segment. An inner or load-carrying slide segment is movably attached to the intermediate slide segment. However, the outer slide segment is mounted to the frame by a plurality of screws, which is inconvenient and time-consuming when one needs to maintain or replace the outer side segment. Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
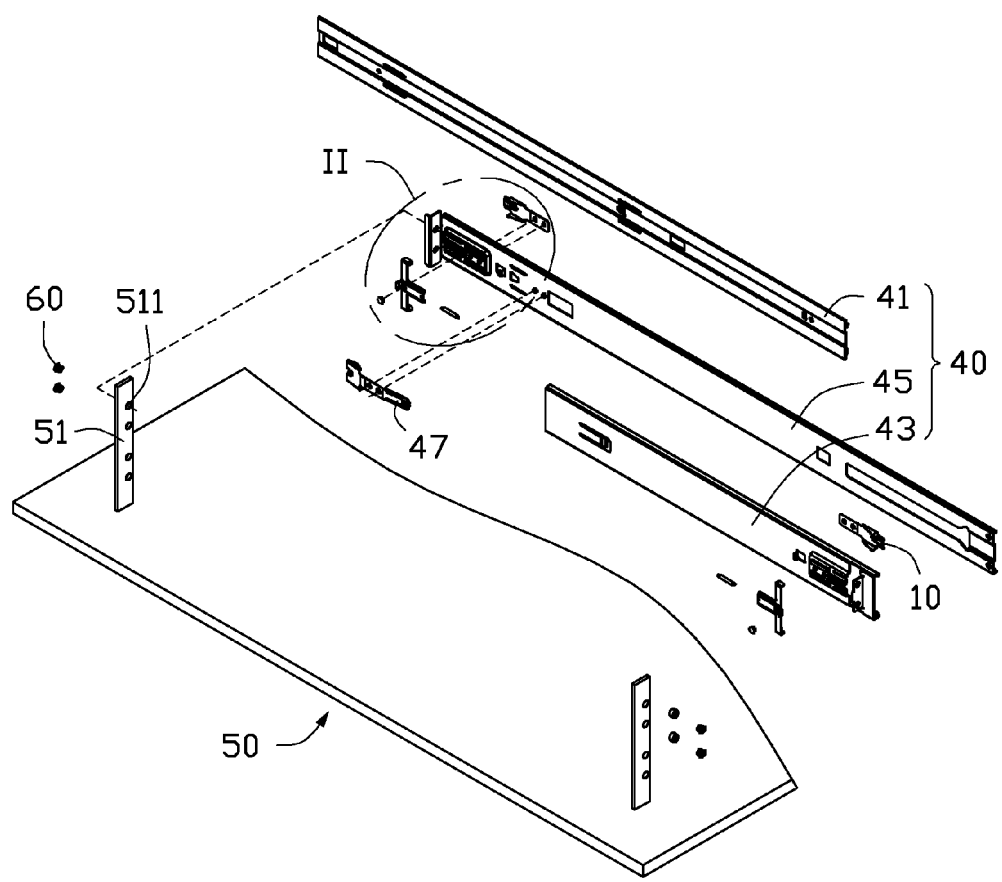
FIG. 1 is an exploded, cutaway view of an embodiment of a slide rail assembly.
Figure 2:
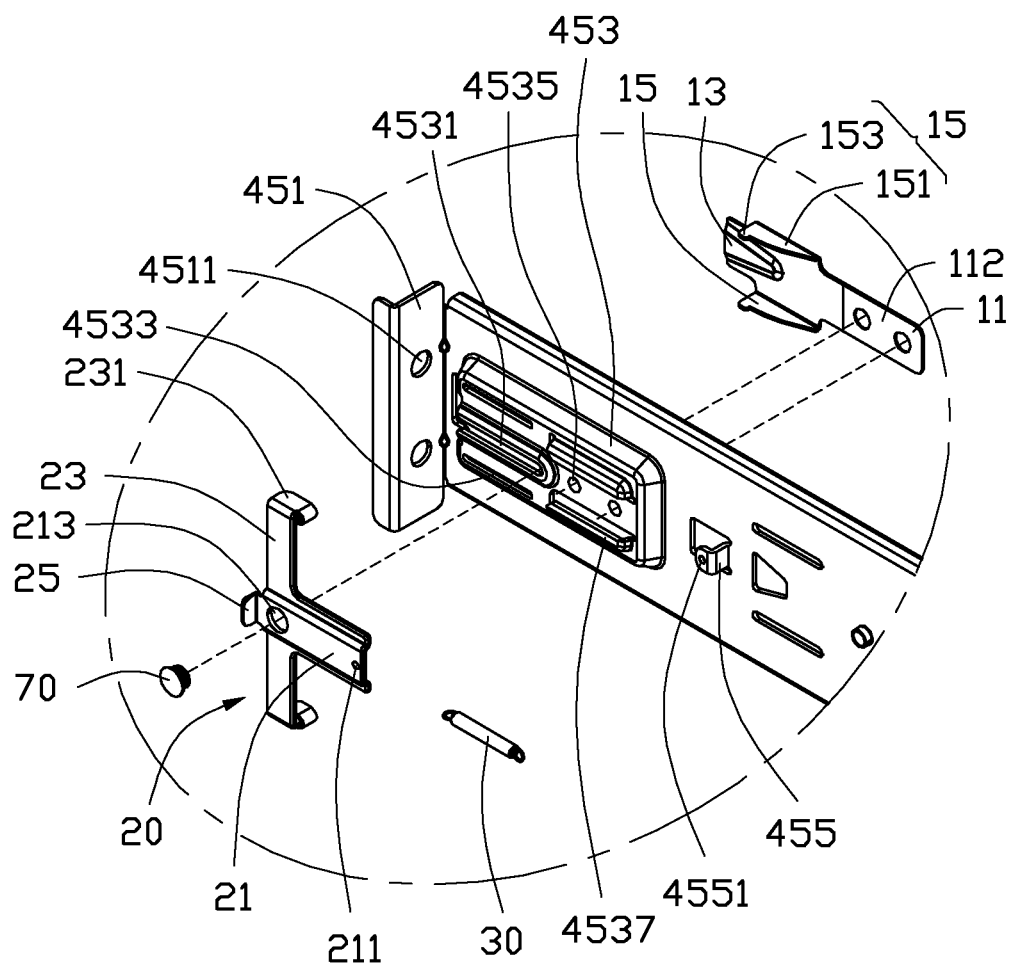
FIG. 2 is an enlarged view of circled portion II of FIG. 1.

FIGS. 1 and 2 illustrate an embodiment of a slide rail assembly. The slide rail assembly comprises two clipping members 10, two driving members 20, two resilient members 30, a sliding rail 40, and a rack 50.

Each clipping member 10 comprises a main body 11 and two resisting pieces 15 extending from opposite side edges of the main body 11, respectively. Two mounting holes 112 are defined in the main body 11, and a clipping portion 13 is located at an end portion of the main body 11. In one embodiment, each resisting piece 15 is substantially perpendicular to the main body 11. Each resisting piece 15 comprises a slanted edge 151 and a blocking portion 153 connected to the slanted edge 151.

Each driving member 20 comprises a driving portion 21, two first operating portions 23 extending from opposite sides of the driving portion 21, respectively, and a second operating portion 25 extending from an end portion of the driving portion 21. A securing hole 211 and a receiving hole 213 are defined in the driving portion 21. A curved portion 231 is located at a distal end portion of each first operating portion 23. In one embodiment, the driving portion 20 is substantially T-shaped.

The sliding rail 40 comprises an inner slide 41, a first outer slide 45, a second outer slide 43, and a mounting member 47. In one embodiment, the mounting member 47 is secured to the first outer slide 45 by bonding and extends through the first outer slide 45 to clip the inner slide 41, for preventing the inner slide 41 from sliding relative to the first outer slide 45.

A retaining panel 451 is connected substantially perpendicular to the first outer slide 45, and a protrusion 453 protrudes from the first outer slide 45. The retaining panel 451 defines two retaining holes 4511. The protrusion 453 defines an opening 4531, two slots 4533, and two positioning holes 4535. The two slots 4533 are defined at opposite sides of the opening 4531. Two strengthening ribs 4537 are located on the protrusion 453 and cooperatively define a sliding passage for the driving member 20. A clamping piece 455 is located on the first outer slide 45 and defines a clamping hole 4551.

The rack 50 comprises two substantially parallel mounting panels 51. A plurality of fixing holes 511 is defined in each mounting panel 51.

Figure 3:
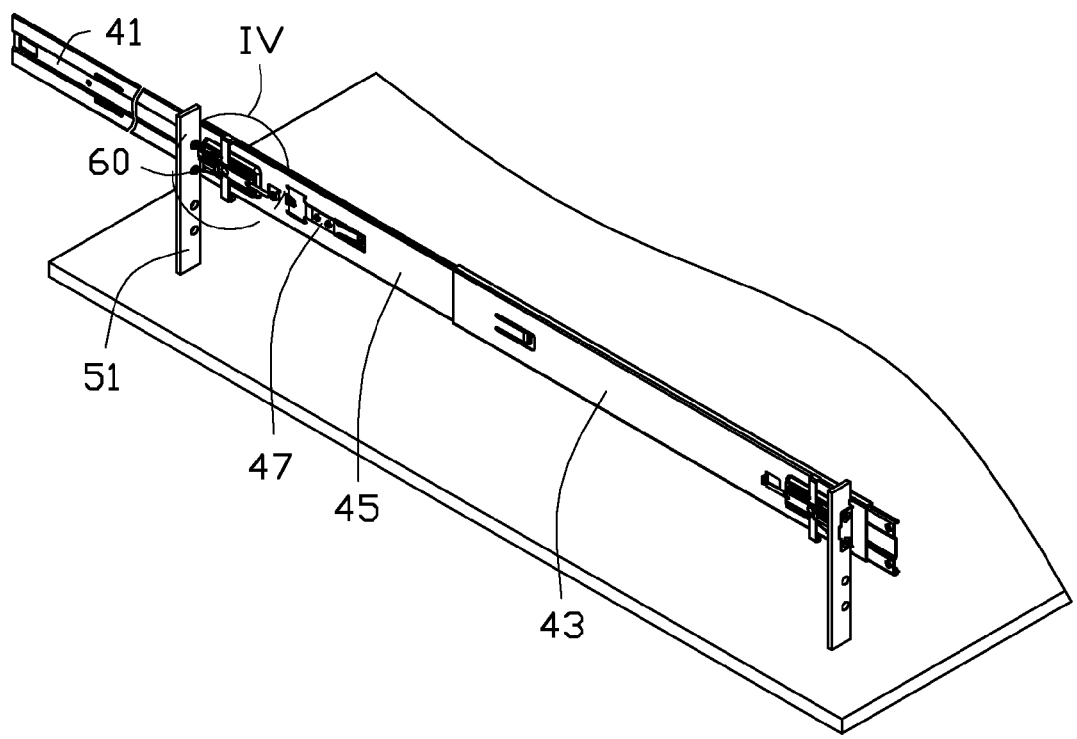
FIG. 3 is an assembled view of the slide rail assembly of FIG. 1.
Figure 4:
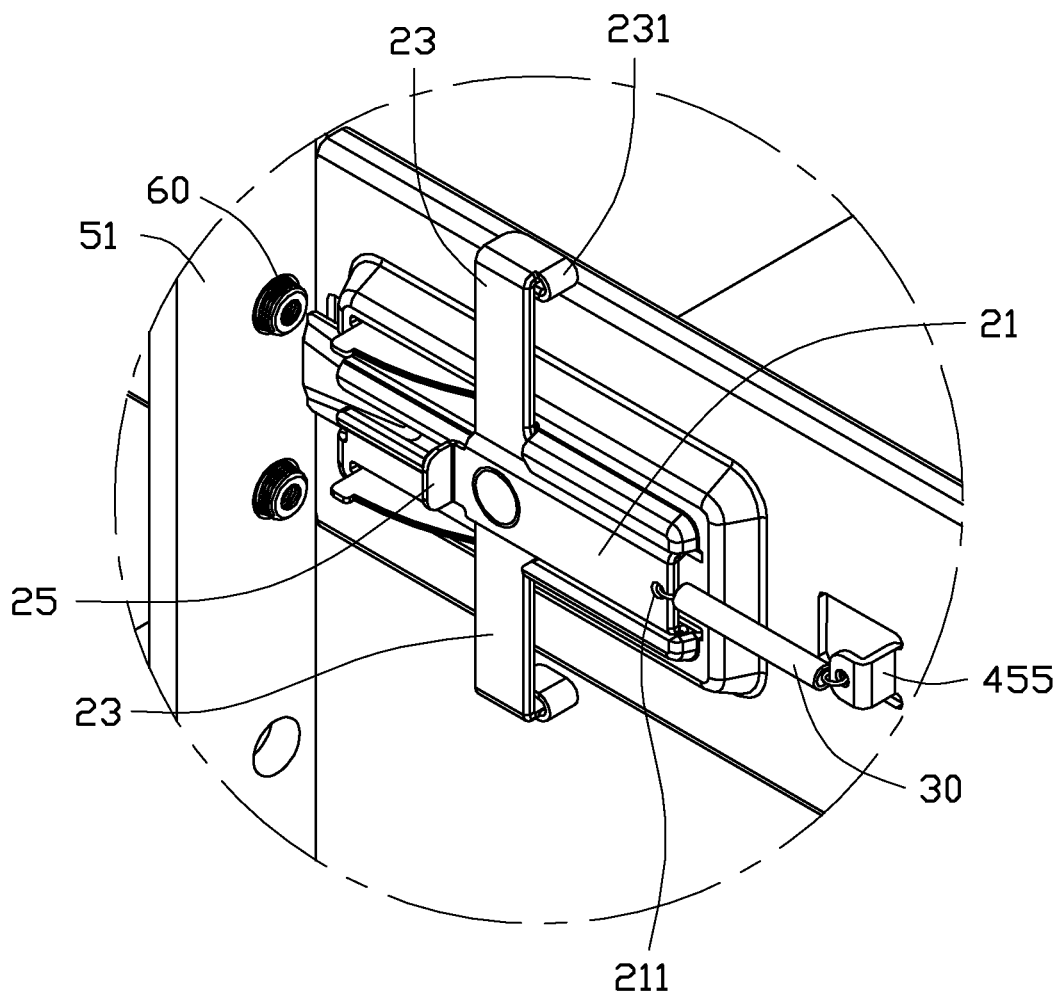
FIG. 4 is an enlarged view of circled portion IV of FIG. 3.
Figure 5:
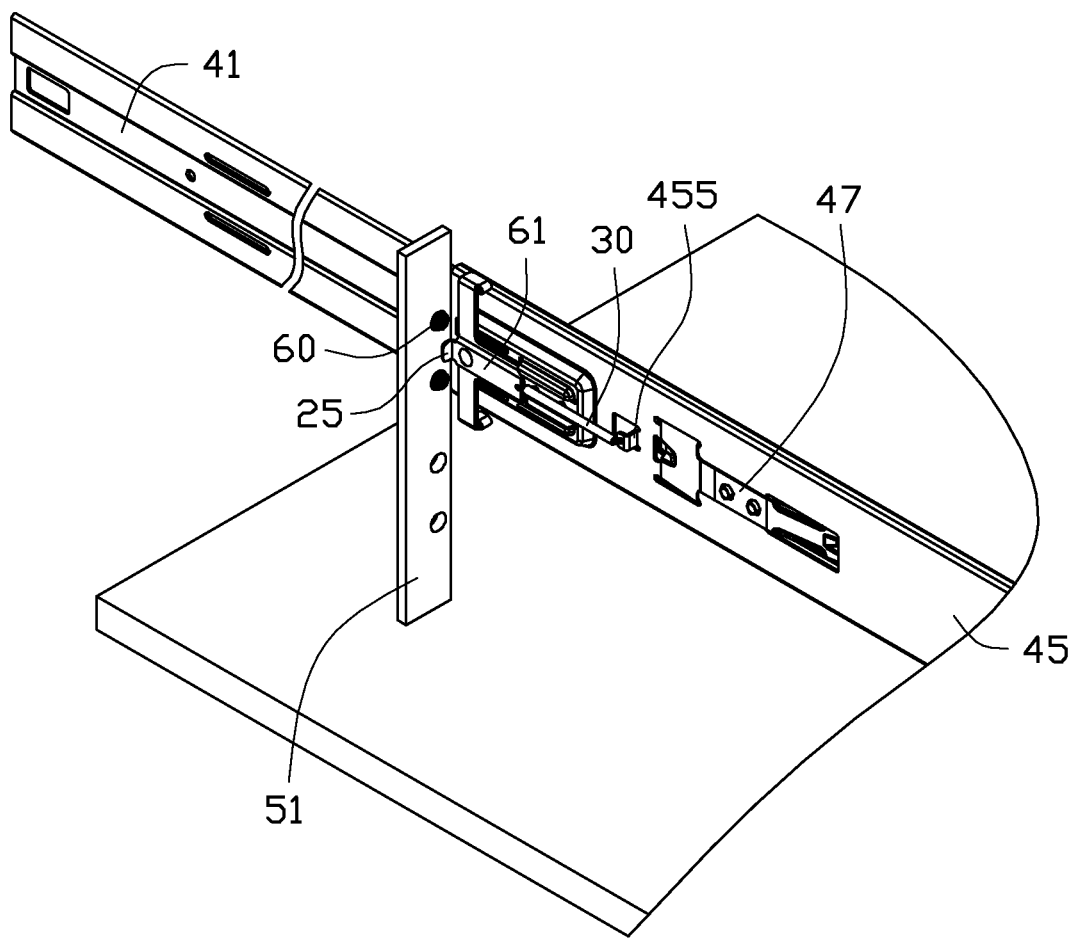
FIG. 5 is similar to FIG. 3, but viewed from a different aspect.

FIGS. 3-5 shows that in assembly, a first clipping member 10, a first driving member 20, and a first resilient member 30 are secured to the first outer slide 45. A second clipping member 10, a second driving member 20, and a second resilient member 30 are secured to the second outer slide 43.

When the first clipping member 10 is secured to the first outer slide 45, the first clipping member 10 is attached to a first side of the first outer slide 45. The two resisting portions 12 extend through the corresponding slots 4533, and the clipping portion 13 is received in the opening 4531. The two mounting holes 112 are aligned with the two positioning holes 4535, two screws (not shown) are engaged in the two mounting holes 112 and the two positioning holes 4535. Thus, the first clipping member 10 is secured to the first outer slide 45. The first driving member 20 is attached to an opposite side of the first outer slide 45 and located between the two strength ribs 4537. A positioning member 70 is received through the receiving hole 213 and received in the opening 4531, thereby slidably securing the driving member 20 to the protrusion 453. A first end of the resilient member 30 is engagingly received in the securing hole 211, and a second end of the resilient member 30 is received in the clamping hole 4551. Thus, the first resilient member 30 is secured to the driving member 20 and the first outer slide 45. In one embodiment, the second clipping member 10 and the second driving member 20 are secured to the second outer slide 43 in a way substantially similar to the way the first clipping member 10 and the first driving member 20 are secured to the first outer slide 45.

When the slide 40 is secured to the mounting panels 51, two positioning members 60 are received in the corresponding retaining holes 4511. The first outer slide 45 is pushed in a direction that is substantially perpendicular to the mounting panel 51.

The clipping portion 13 is deformable away from the mounting panel 51 by the mounting panel 51, until the clipping portion 13 extends through the mounting panel 51, and is released to clip to an inner surface of the mounting panel 51 (see FIG. 4). At this time, the retaining panel 451 is adhered to an outer surface of the mounting panel 51, and the two positioning members 60 are received in the corresponding two fixing holes 511. The driving member 20 abuts a first end of the slanted edge 151 away from the blocking portion 153.

In disassembly, the driving member 20 is slid relative to the first outer slide 45 in a direction that is substantially parallel to the first outer slide 45, thereby deforming the resilient member 30. The driving member 20 is moved along the slanted edge 151 until the driving member 20 is blocked by the blocking portion 153 (see FIG. 5). Simultaneously, the clipping member 10 is deformed away from the mounting panel 51 by the driving member 13, and the clipping portion 13 can be disengaged from the mounting panel 51. The slide rail 40 is pulled, and the two positioning members 60 are removed from the two corresponding fixing holes 511. Therefore, the slide rail 40 is easily detached from the mounting panels 51.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A slide rail assembly comprising:
   a mounting panel;
   a slide rail secured to the mounting panel and comprising an outer slide; the outer slide comprising a retaining panel attached to an outer surface of the mounting panel;
   a clipping member located on a first side of the outer slide; the clipping member is attached to an inner surface of the mounting panel, for preventing the slide rail from moving in a direction that is substantially perpendicular to the mounting panel; and
   a driving member located on a second opposite side of the outer slide; the driving member slidably attached to the outer slide;
   wherein the driving member abuts the clipping member, and the clipping member is deformable to disengage from the mounting panel by the driving member sliding relative to the outer slide.

2. The slide rail assembly of claim 1, further comprising a resilient member, wherein the resilient member is secured to the outer slide and the driving member, and the resilient member is deformed when the driving member is slid.

3. The slide rail assembly of claim 2, wherein a deformable direction of the resilient member is substantially parallel to the outer slide.

4. The slide rail assembly of claim 1, wherein the clipping member comprises a main body and a clipping portion located on the main body, the outer slide defines an opening, the clipping portion extends through the opening and abuts the inner surface of the mounting panel.

5. The slide rail assembly of claim 4, wherein the outer slide further defines a slot, the clipping member further comprises a resisting portion, and the resisting portion extends through the slot and abuts the driving member.

6. The slide rail assembly of claim 5, wherein the resisting portion comprises a slanted edge and a blocking portion connected to the slanted edge, and the driving member is slidable along the slanted edge and blocked by the blocking portion.

7. The slide rail assembly of claim 1, wherein the driving member comprises a driving portion and two first operating portions, and the two first operating portions are located on opposite sides of the driving portion.

8. The slide rail assembly of claim 1, wherein the driving member is substantially T-shaped.

9. A slide rail assembly comprising:
   a mounting panel;
   a slide rail secured to the mounting panel and comprising an outer slide; the outer slide comprising a retaining panel attached to an outer surface of the mounting panel; an opening and a slot are defined in the slide rail;
   a clipping member located on a first side of the outer slide; the clipping member comprises a clipping portion and a resisting portion; the clipping portion extends through the opening and is attached to an inner surface of the mounting panel, for preventing the slide rail from moving in a direction that is substantially perpendicular to the mounting panel; the resisting portion comprises a slanted edge; and
   a driving member located on a second opposite side of the outer slide; the driving member slidably attached to the slanted edge;
   wherein the driving member is slidable along the slanted edge to deform the clipping member, so that the clipping portion is disengaged from the mounting panel.

10. The slide rail assembly of claim 9, further comprising a resilient member, wherein the resilient member is secured to the outer slide and the driving member, and the resilient member is deformed when the driving member is slid.

11. The slide rail assembly of claim 10, wherein a deformable direction of the resilient member is substantially parallel to the outer slide.

12. The slide rail assembly of claim 10, wherein the outer slide comprises a clamping piece, the driving member defines a securing hole, a first end of the resilient member is engaged in the securing hole, and a second end of the resilient member is engaged with the clamping piece.

13. The slide rail assembly of claim 9, wherein the resisting portion further comprises a blocking portion connected to the slanted edge, and the driving member is slidable along the slanted edge and blocked by the blocking portion.

14. The slide rail assembly of claim 9, wherein the driving member comprises a driving portion and two first operating portions, and the two first operating portions are located on opposite sides of the driving portion.

15. The slide rail assembly of claim 14, wherein the driving member further comprises a second driving portion, and the second driving portion extends from a free end of the driving portion and located between the two first driving portion.

16. The slide rail assembly of claim 9, wherein the driving member is substantially T-shaped.

* * * * *